(12) United States Patent
Kobayashi et al.

(10) Patent No.: US 10,622,151 B2
(45) Date of Patent: Apr. 14, 2020

(54) ELECTRONIC COMPONENT AND ELECTRONIC COMPONENT MOUNTING CIRCUIT BOARD

(71) Applicant: TAIYO YUDEN CO., LTD., Chuo-ku, Tokyo (JP)

(72) Inventors: Satoshi Kobayashi, Takasaki (JP); Takahisa Fukuda, Takasaki (JP); Tomoaki Nakamura, Takasaki (JP); Mikio Tahara, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/183,478

(22) Filed: Nov. 7, 2018

(65) Prior Publication Data
US 2019/0148070 A1    May 16, 2019

(30) Foreign Application Priority Data

Nov. 15, 2017  (JP) ................... 2017-219978

(51) Int. Cl.
*H01G 4/232*   (2006.01)
*H01G 4/248*   (2006.01)
(Continued)

(52) U.S. Cl.
CPC ............ *H01G 4/248* (2013.01); *H01G 4/232* (2013.01); *H01G 4/30* (2013.01); *H05K 1/111* (2013.01);
(Continued)

(58) Field of Classification Search
CPC .......... H01G 4/232; H01G 4/248; H01G 4/30; H01G 4/012; H01G 4/10; H01G 4/12;
(Continued)

(56) References Cited

U.S. PATENT DOCUMENTS

| 2014/0233147 A1* | 8/2014 | Hong | H01G 4/008 361/301.4 |
| 2014/0326494 A1* | 11/2014 | Chung | H01G 4/018 174/260 |

(Continued)

FOREIGN PATENT DOCUMENTS

JP      2017034010 A    2/2017

*Primary Examiner* — Timothy J Thompson
*Assistant Examiner* — Guillermo J Egoavil
(74) *Attorney, Agent, or Firm* — Law Office of Katsuhiro Arai

(57) ABSTRACT

In an exemplary embodiment, a multilayer ceramic capacitor has, at two opposing respective end parts of a capacitor body 11 of roughly rectangular solid shape, external electrodes 12 that each have a conductive resin layer F3 inside. Each of the external electrodes 12 continuously has an end face part 12a corresponding to one face, and a wraparound part 12b corresponding to four faces surrounding the one face, of the capacitor body 11. Also, the end face part 12a of each of the external electrodes 12 has a bulging part 12a1 on the outer face of the end face part 12a. An electronic component using the multilayer ceramic capacitor can maximally prevent the Manhattan phenomenon that may otherwise occur when the electronic component is mounted on a circuit board, even though its external electrodes have the conductive resin layer inside.

19 Claims, 3 Drawing Sheets

(51) Int. Cl.
*H01G 4/30* (2006.01)
*H05K 1/11* (2006.01)
*H05K 1/18* (2006.01)
*H05K 3/34* (2006.01)

(52) U.S. Cl.
CPC .......... *H05K 3/3442* (2013.01); *H05K 1/181* (2013.01); *H05K 2201/10015* (2013.01); *H05K 2201/10636* (2013.01)

(58) Field of Classification Search
CPC .. H01G 4/1227; H01G 4/1236; H01G 4/2325; H05K 1/111; H05K 1/181; H05K 1/11; H05K 1/18; H05K 3/3442; H05K 2201/10015; H05K 2201/10636
USPC ........................................ 174/260; 361/306.3
See application file for complete search history.

(56) References Cited

U.S. PATENT DOCUMENTS

| | | | |
|---|---|---|---|
| 2017/0294268 A1* | 10/2017 | Katsuta | H01G 4/012 |
| 2018/0033556 A1* | 2/2018 | Itamochi | H01C 7/008 |
| 2019/0066925 A1* | 2/2019 | Satoh | H01G 4/248 |

* cited by examiner

FIG. 5

| Prototype | D1 [10] | D1 [12] | D1 [F3a+F3a1] | D1 [F3a] | D3 [F3b] | Manhattan phenomenon | Exterior defect |
|---|---|---|---|---|---|---|---|
| PR1 | 1060 μm | 100 μm | 25 μm | 3 μm | 15 μm | 2/400 | 0/400 |
| PR2 | 1060 μm | 110 μm | 25 μm | 3 μm | 15 μm | 0/400 | 0/400 |
| PR3 | 1060 μm | 130 μm | 25 μm | 3 μm | 15 μm | 0/400 | 0/400 |
| PR4 | 1060 μm | 190 μm | 25 μm | 3 μm | 15 μm | 0/400 | 0/400 |
| PR5 | 1060 μm | 250 μm | 25 μm | 3 μm | 15 μm | 0/400 | 0/400 |
| PR6 | 1060 μm | 310 μm | 25 μm | 3 μm | 15 μm | 0/400 | 0/400 |
| PR7 | 1060 μm | 370 μm | 25 μm | 3 μm | 15 μm | 0/400 | 0/400 |
| PR8 | 1060 μm | 430 μm | 25 μm | 3 μm | 15 μm | 0/400 | 0/400 |
| PR9 | 1060 μm | 490 μm | 25 μm | 3 μm | 15 μm | 0/400 | 7/400 |
| PR10 | 1030 μm | 250 μm | 10 μm | 3 μm | 15 μm | 1/400 | 0/400 |
| PR11 | 1032 μm | 250 μm | 11 μm | 3 μm | 15 μm | 0/400 | 0/400 |
| PR12 | 1036 μm | 250 μm | 13 μm | 3 μm | 15 μm | 0/400 | 0/400 |
| PR13 | 1048 μm | 250 μm | 19 μm | 3 μm | 15 μm | 0/400 | 0/400 |
| PR14 | 1060 μm | 250 μm | 25 μm | 3 μm | 15 μm | 0/400 | 0/400 |
| PR15 | 1060 μm | 250 μm | 25 μm | 2 μm | 15 μm | 0/400 | 21/400 |
| PR16 | 1060 μm | 250 μm | 25 μm | 3 μm | 15 μm | 0/400 | 0/400 |
| PR17 | 1060 μm | 250 μm | 25 μm | 6 μm | 15 μm | 0/400 | 0/400 |
| PR18 | 1060 μm | 250 μm | 25 μm | 9 μm | 15 μm | 0/400 | 0/400 |
| PR19 | 1060 μm | 250 μm | 25 μm | 12 μm | 15 μm | 0/400 | 0/400 |
| PR20 | 1060 μm | 250 μm | 25 μm | 13 μm | 15 μm | 1/400 | 0/400 |
| PR21 | 1060 μm | 250 μm | 25 μm | 3 μm | 3 μm | 0/400 | 68/400 |
| PR22 | 1060 μm | 250 μm | 25 μm | 3 μm | 5 μm | 0/400 | 0/400 |
| PR23 | 1060 μm | 250 μm | 25 μm | 3 μm | 15 μm | 0/400 | 0/400 |
| PR24 | 1060 μm | 250 μm | 25 μm | 3 μm | 20 μm | 0/400 | 0/400 |
| PR25 | 1060 μm | 250 μm | 25 μm | 3 μm | 25 μm | 0/400 | 0/400 |
| PR26 | 1060 μm | 250 μm | 25 μm | 3 μm | 26 μm | 2/400 | 0/400 |

ELECTRONIC COMPONENT AND ELECTRONIC COMPONENT MOUNTING CIRCUIT BOARD

BACKGROUND

Field of the Invention

The present invention relates to an electronic component having a pair of external electrodes that have a conductive resin layer inside, as well as an electronic component mounting circuit board constituted by the electronic component being mounted on a circuit board.

Description of the Related Art

Patent Literature 1 mentioned below discloses an electronic component (multilayer ceramic capacitor) having a pair of external electrodes that have a conductive resin layer inside. The role of this conductive resin layer in the external electrodes is to mitigate any thermal or mechanical impact, if received, on the electronic component after it has been mounted on a circuit board, or specifically on the electronic component after its external electrodes have been connected to conductor pads on a circuit board by means of solder, and thereby prevent the electronic component from sustaining cracks and other damage.

It should be noted that the aforementioned conductive resin layer is generally produced by applying and then curing a conductive resin paste, which means that if the conductive resin layer is a five-face type that continuously has an end face part corresponding to one face, and a wraparound part corresponding to four faces surrounding the one face, of a component body of roughly rectangular solid shape, then the roundness appearing on the outer face of the wraparound part tends to become more pronounced than the roundness appearing on the outer face of the end face part of the conductive resin layer. For this reason, using electroplating or other method to produce a metal layer in a manner covering the entire outer faces of this conductive resin layer causes roundness, which corresponds to the roundness of the conductive resin layer, to appear on the outer face of this metal layer. What this means is that, in the case of a five-face type external electrode that continuously has an end face part corresponding to one face, and a wraparound part corresponding to four faces surrounding it, of the component body, then the roundness appearing on the outer face of the wraparound part tends to become more pronounced than the roundness appearing on the outer face of the end face part of the external electrode.

The result is that, when the electronic component is mounted on a circuit board, or specifically when a part of the wraparound part of each external electrode of the electronic component (a part corresponding to one surrounding face of the component body) is connected to a conductor pad on a circuit board by means of solder, the molten solder behaves differently between the outer face of the end face part and the outer face of a part of the wraparound part due to the aforementioned roundness difference between the outer faces. To be specific, because the roundness of the outer face of the end face part of the external electrode is not very pronounced, the molten solder easily wets and spreads over the outer face of the end face part; on the other hand, because the roundness of the outer face of a part of the wraparound part of the external electrode is pronounced, the molten solder does not easily wet and spread over the outer face of a part of the wraparound part.

In other words, the surface tension of the molten solder that has wetted and spread over the outer face of the end face part of the external electrode (corresponding to the force that tends to lift the component body) becomes greater than the surface tension of the molten solder that has wetted and spread over the outer face of a part of the wraparound part (corresponding to the force that counteracts the force that tends to lift the component body), and this often leads to a phenomenon characterized by the electronic component "standing up" when its external electrodes are connected to conductor pads on a circuit board by means of solder ("Manhattan phenomenon").

BACKGROUND ART LITERATURES

[Patent Literature 1] Japanese Patent Laid-open No. 2017-034010

SUMMARY

An object of the present invention is to provide an electronic component that can maximally prevent the Manhattan phenomenon that may otherwise occur when the electronic component is mounted on a circuit board, even in the case that its external electrodes have a conductive resin layer inside, as well as an electronic component mounting circuit board constituted by the electronic component being mounted on a circuit board.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the electronic component pertaining to the present invention is an electronic component having, at two opposing respective end parts of a component body of roughly rectangular solid shape, external electrodes that each have a conductive resin layer inside, and when, with respect to the component body, the direction in which two opposing faces are facing each other represents a first direction, the direction in which other two opposing faces are facing each other represents a second direction, and the direction in which the remaining two opposing faces are facing each other represents a third direction, and dimensions along the respective directions are denoted as a first-direction dimension, a second-direction dimension and a third-direction dimension, then each of the external electrodes continuously has an end face part corresponding to an end face in the first direction, and a wraparound part corresponding to four faces surrounding the end face, of the component body, and the end face part of each of the external electrodes has a bulging part on the outer face of the end face part. On the other hand, the electronic component mounting circuit board pertaining to the present invention is constituted by the aforementioned electronic component being mounted on a circuit board.

According to the electronic component and the electronic component mounting circuit board pertaining to the present invention, the Manhattan phenomenon that may otherwise occur when the electronic component is mounted on the circuit board, can be maximally prevented even in the case that the external electrodes of the electronic component have a conductive resin layer inside.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 5 is a table showing an example of verification of the operations and effects pertaining to the multilayer ceramic capacitor shown in FIG. 1.

DESCRIPTION OF THE SYMBOLS

10—Multilayer ceramic capacitor, 11—Capacitor body, 11a—Internal electrode layers, 11b—Dielectric layers, 12—External electrodes, 12a—End face part of each of the external electrodes, 12a1—Bulging part of each of the external electrodes, 12b—Wraparound part of each of the external electrodes, F1—First metal layer, F2—Second metal layer, F3—Conductive resin layer, F3a—End face part of the conductive resin layer, F3a1—Bulging part of the conductive resin layer, F3b—Wraparound part of the conductive resin layer, F4—Third metal layer.

DETAILED DESCRIPTION OF EMBODIMENTS

With respect to a capacitor body 11 described below, the direction in which two opposing faces are facing each other (corresponding to the lateral direction in FIGS. 1 and 2, and also corresponding to the direction in which external electrodes 12 described below are facing each other) is referred to as "a first direction d1," the direction in which other two opposing faces are facing each other (corresponding to the vertical direction in FIG. 1) is referred to as "a second direction d2," and the direction in which the remaining two opposing faces are facing each other (corresponding to the vertical direction in FIG. 2, and also corresponding to the direction in which internal electrode layers 11a described below are stacked) is referred to as "a third direction d3," in the explanations below, for the sake of convenience.

Also, with respect to each constituent, the dimension along the first direction d1 is denoted as "a first-direction dimension D1 [a symbol of the constituent]," the dimension along the second direction d2 is denoted as "a second-direction dimension D2 [a symbol of the constituent]," and the dimension along the third direction d3 is denoted as "a third-direction dimension D3 [a symbol of the constituent]."

It should be noted that the values illustrated as dimensions D1 [a symbol of the constituent] to D3 [a symbol of the constituent] indicate reference dimensions for design purposes, and do not include dimensional tolerances for manufacturing purposes.

Figure 1:
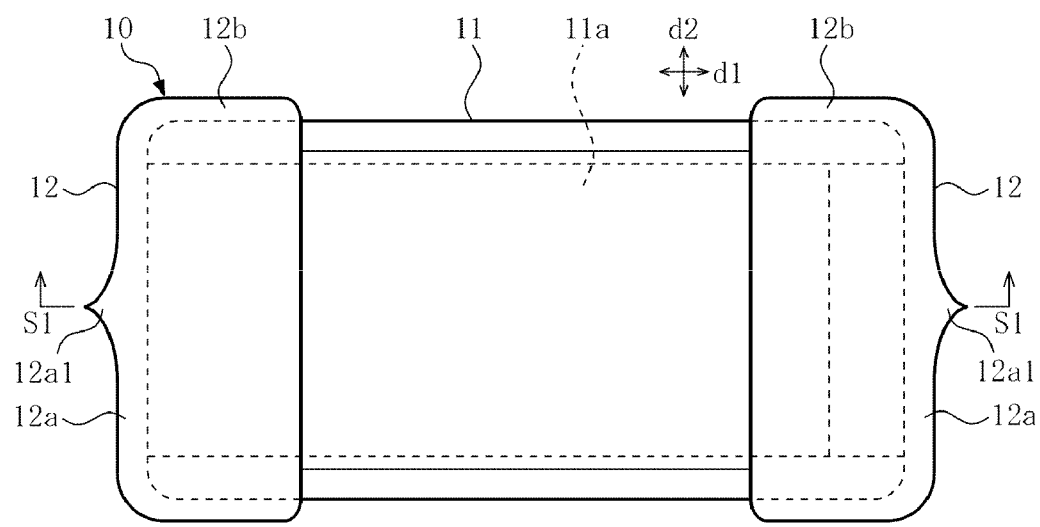
FIG. 1 is a plan view of a multilayer ceramic capacitor to which the present invention is applied.
Figure 2:
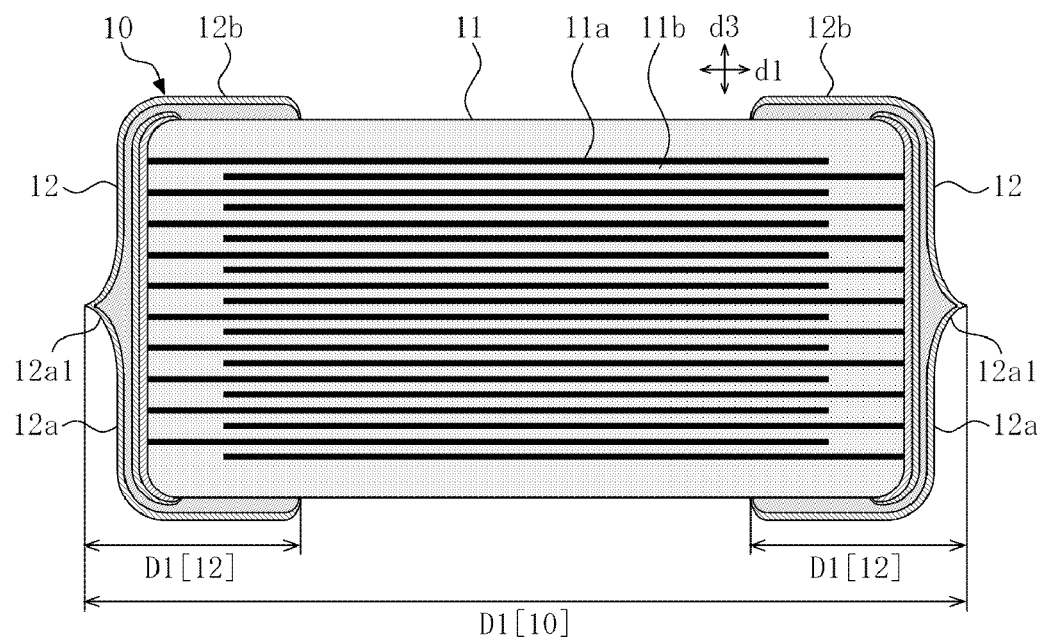
FIG. 2 is a cross-sectional view of FIG. 1 along line S1-S1.
Figure 3:
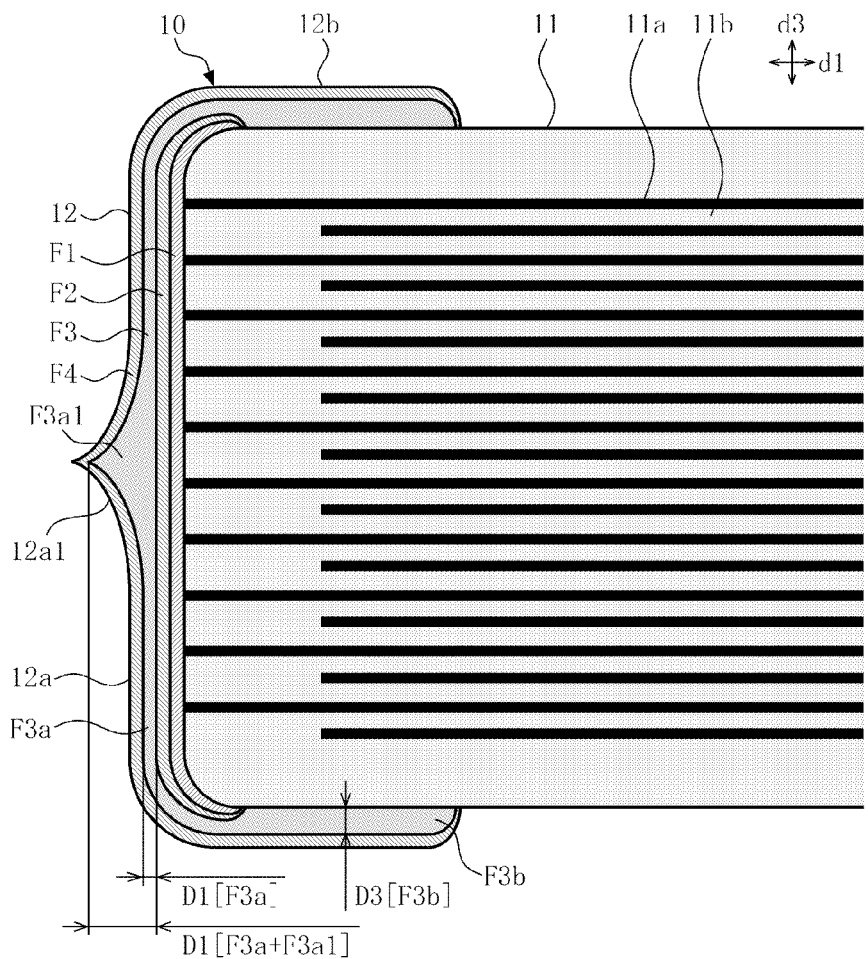
FIG. 3 is a partially enlarged view of FIG. 2.

First, the constitution of a multilayer ceramic capacitor 10 to which the present invention is applied, is explained using FIGS. 1 to 3.

The multilayer ceramic capacitor 10 has, at two opposing respective end parts of the capacitor body 11 of roughly rectangular solid shape in the first direction d1, the external electrodes 12 that each have a conductive resin layer F3 inside. It should be noted that the external electrodes 12 have the same constitution and are therefore each denoted using the same symbol.

On the capacitor body 11, all its ridges and corners are rounded. Also, the capacitor body 11 has a capacitive part (not accompanied by a symbol) which is constituted by multiple internal electrode layers 11a (total 20 layers in FIGS. 2 and 3) stacked together with dielectric layers 11b (total 19 layers in FIGS. 2 and 3) in between, and this capacitive part (not accompanied by a symbol) is surrounded by dielectric margin parts (not accompanied by a symbol) on both sides in the second direction d2 and dielectric margin parts (not accompanied by a symbol) on both sides in the third direction d3. As shown in FIG. 2, the multiple internal electrode layers 11a are staggered alternately in the first direction d1, and the ends of odd-numbered internal electrode layers 11a from the top in the first direction d1 are connected to one of the external electrodes 12 (one of the external electrodes 12 on the left side in FIG. 2), while the ends of even-numbered internal electrode layers 11a from the top in the first direction d1 are connected to the other of the external electrodes 12 (the other of the external electrodes 12 on the right side in FIG. 2).

For the primary component of each of the internal electrode layers 11a, preferably a metal such as nickel, copper, palladium, platinum, silver, gold, or alloy thereof, is used. Also, for the primary component of each of the dielectric layers 11b and each of the dielectric margin parts (not accompanied by a symbol), preferably a dielectric ceramic such as barium titanate, strontium titanate, calcium titanate, magnesium titanate, calcium zirconate, calcium zirconate titanate, barium zirconate, or titanium oxide is used. It should be noted that the primary component of the dielectric layers 11b may be different from the primary component of the dielectric margin parts (not accompanied by a symbol) on both sides in the third direction d3, or the primary component of the dielectric layers 11b, the primary component of one of the dielectric margin parts (not accompanied by a symbol) in the third direction d3, and the primary component of the other of the dielectric margin parts (not accompanied by a symbol) in the third direction d3, may all be different.

It should be noted that, with respect to the capacitor body 11, an example of preferable numerical range of a first-direction dimension D1 [11] is 400 to 1600 µm, while an example of preferable numerical range of a second-direction dimension D2 [11], or that of a third-direction dimension D3 [11], is 50 to 800 µm.

In addition, while FIGS. 2 and 3 depict a total of 20 of the internal electrode layers 11a in the capacitor body 11 for the sake of illustration, the number of the internal electrode layers 11a, and a first-direction dimension D1 [11a] and a second-direction dimension D2 [11a] of each of the internal electrode layers 11a, may be changed as desired according to the target capacitance value.

Furthermore, an example of preferable numerical range of a third-direction dimension D3 [11a] (corresponding to a thickness) of each of the internal electrode layers 11a is 0.3 to 1.5 μm, while an example of preferable numerical range of a third-direction dimension D3 [11b] (corresponding to a thickness) of each of the dielectric layers 11b is 0.5 to 4.0 μm, although the specific ranges vary depending on the number of the internal electrode layers 11a and the target capacitance value.

Each of the external electrodes 12 is a five-face type that continuously has, with respect to the capacitor body 11, an end face part 12a of roughly rectangular shape corresponding to an end face in the first direction d1 (the left end face or the right end face in FIG. 2), and a wraparound part 12b of roughly rectangular sleeve shape corresponding to four faces surrounding the end face (both end faces in the second direction d2 and both end faces in the third direction d3 of the capacitor body 11, in other words, the top and bottom faces in FIG. 1 and the top and bottom faces in FIG. 2). Also, the end face part 12a has a bulging part 12a1 on the outer face of the end face part 12a, or preferably in the center area on the outer face of the end face part 12a. Preferably the bulging part 12a1 forms a tapered solid shape such as roughly a cone shape or roughly a frustum shape.

The aforementioned "center area" refers to a circular or non-circular zone that includes the center of the end face part 12a of each of the external electrodes 12 when the end face part 12a is viewed from the left or right side of FIG. 1 (such as a zone having an area corresponding to one-fourth to one-tenth the area of the outer face of the end face part 12a). In other words, while the bulging part 12a1 is preferably positioned within the center area on the outer face of the end face part 12a, it can also be provided at a position partially overlapping, or at a position completely outside of, the center area. Additionally, even if the end face part 12a is provided so that the bulging part 12a1 is positioned within the center area, the center of the bulging part 12a1 may align with the center of the end face part 12a, or the center of the bulging part 12a1 may deviate slightly from the center of the end face part 12a.

Also, each of the external electrodes 12 is constituted by four layers, as shown in FIG. 3, including a first metal layer F1, a second metal layer F2, a conductive resin layer F3, and a third metal layer F4. The first metal layer F1 is attached primarily to an end face (the left end face or the right end face in FIG. 2) of the capacitor body 11 in the first direction d1, the second metal layer F2 covers the entire outer face of the first metal layer F1, and the third metal layer F4 covers the entire outer face of the conductive resin layer F3.

For the primary component of the first metal layer F1, preferably a metal such as nickel, copper, palladium, platinum, silver, gold, or alloy thereof, may be used. Also, for the method to produce the first metal layer F1, preferably a method that involves applying a metal paste according to a dip method, printing method, etc., and then baking the metal paste is used; however, a dry plating method such as sputtering or vacuum deposition can also be used.

For the primary component of the second metal layer F2, preferably a metal selected from the group that includes copper, tin, nickel, gold, zinc, alloys thereof, etc., wherein the metal is different from the primary component of the first metal layer F1, is used. Also, for the method to produce the second metal layer F2, preferably a wet plating method such as electroplating is used; however, a dry plating method such as sputtering or vacuum deposition can also be used.

The conductive resin layer F3 is a five-face type that continuously has, with respect to the capacitor body 11, an end face part F3a of roughly rectangular shape corresponding to an end face in the first direction d1 (the left end face or the right end face in FIG. 2), and a wraparound part F3b of roughly rectangular sleeve shape corresponding to four faces surrounding the end face (both end faces in the second direction d2 and both end faces in the third direction d3 of the capacitor body 11, in other words, the top and bottom faces in FIG. 1 and the top and bottom faces in FIG. 2), where the wraparound part F3b is also in contact with the capacitor body 11. Also, the end face part F3a has a bulging part F3a1 on the outer face of the end face part F3a, or preferably in the center area on the outer face of the end face part F3a. Preferably the bulging part F3a1 forms a tapered solid shape such as roughly a cone shape or roughly a frustum shape.

Similar to the aforementioned center area of the outer face of the end face part 12a of each of the external electrodes 12, the aforementioned "center area" refers to a circular or non-circular zone that includes the center of the end face part F3a of the conductive resin layer F3 when the end face part F3a is viewed from the left or right side of FIG. 1 (such as a zone having an area corresponding to one-fourth to one-tenth the area of the outer face of the end face part F3a). In other words, while the bulging part F3a1 is preferably positioned within the center area on the outer face of the end face part F3a, it can also be provided at a position partially overlapping, or at a position completely outside of, the center area. Additionally, even if the end face part F3a is provided so that the bulging part F3a1 is positioned within the center area, the center of the bulging part F3a1 may align with the center of the end face part F3a, or the center of the bulging part F3a1 may deviate slightly from the center of the end face part F3a.

For the primary component of the conductive resin layer F3, preferably a thermosetting resin such as epoxy resin, phenol resin, urethane resin, silicone resin, or polyimide resin, and a conductive filler made of a metal such as copper, tin, nickel, gold, zinc, or alloy thereof, is used. The conductive filler is not limited in any way, so long as the filler has a form, such as a spherical, flat, or fiber form, which ensures conductivity. Also, for the method to produce the conductive resin layer F3, a method that involves applying a conductive resin paste according to a dip method, printing method, etc., and then thermally curing the conductive resin paste, is preferably used. The form of the bulging part F3a1 may be achieved by actively raising the outer face of the part of the conductive resin layer F3 that becomes the end face part F3a, or preferably the center area on the outer face of the end face part F3a, when the conductive resin paste is applied, or it may also be achieved by forming a raised part, via post-processing, on the outer face of the part of the conductive resin layer F3 that becomes the end face part F3a, or preferably the center area on the outer face of the end face part F3a, after the conductive resin paste has been applied.

For the primary component of the third metal layer F4, preferably a metal such as tin, copper, nickel, gold, zinc, or alloy thereof, is used. Also, for the method to produce the third metal layer F4, preferably a wet plating method such as electroplating is used; however, a dry plating method such as sputtering or vacuum deposition can also be used. It should be noted that the third metal layer F4 may be constituted by two metal layers, in which case preferably the primary component of the metal layer on the inner side is nickel, while the primary component of the metal layer on the outer side is tin.

It should be noted that, with respect to each of the external electrodes 12, an example of preferable value of a first-direction dimension D1 [12] of each of the external electrodes 12 including the bulging part 12a1 is equal to or greater than 10% of a first-direction dimension D1 [10], but no more than 40% of the first-direction dimension D1 [10], of the multilayer ceramic capacitor 10, regardless of the first-direction dimension D1 [11] of the capacitor body 11.

Also, an example of preferable numerical range of a first-direction dimension D1 [F1] (corresponding to a thickness) of the first metal layer F1 is 1 to 10 μm, while an example of preferable numerical range of a first-direction dimension D1 [F2] (corresponding to a thickness) of the second metal layer F2 is 0.5 to 3 μm.

Furthermore, an example of preferable value of a first-direction dimension D1 [F3a+F3a1] of the end face part F3a of the conductive resin layer F3 including the bulging part F3a1 is equal to or greater than 1% of the first-direction dimension D1 [10] of the multilayer ceramic capacitor 10, but no more than 10% of the first-direction dimension D1 [12] of each of the external electrodes 12 including the bulging part 12a1.

Furthermore, an example of preferable value of a first-direction dimension D1 [F3a] of the end face part F3a of the conductive resin layer F3 excluding the bulging part F3a1 is equal to or smaller than 48% of the first-direction dimension D1 [F3a+F3a1], but no smaller than 12% of the first-direction dimension D1 [F3a+F3a1], of the end face part F3a of the conductive resin layer F3 including the bulging part F3a1.

Furthermore, an example of preferable value of a second-direction dimension D2 [F3b], and a third-direction dimension D3 [F3b] (corresponding to a thickness), of the wraparound part F3b of the conductive resin layer F3, is equal to or smaller than the first-direction dimension D1 [F3a+F3a1] of the end face part F3a of the conductive resin layer F3 including the bulging part F3a1, but greater than the first-direction dimension D1 [F3a] of the end face part F3a of the conductive resin layer F3 excluding the bulging part F3a1.

Incidentally, a preferable example of numerical range of a first-direction dimension D1 [F4] (corresponding to a thickness) of an end face part (not accompanied by a symbol), and a second-direction dimension D2 [F4] and a third-direction dimension D3 [F4] (corresponding to a thickness) of a wraparound part (not accompanied by a symbol), of the third metal layer F4, is 1 to 20 μm.

It should be noted that, although each of the external electrodes 12 shown in the drawings is constituted by four layers including the first metal layer F1, the second metal layer F2, the conductive resin layer F3, and the third metal layer F4, each of the electrodes may be constituted by three layers by eliminating either the first metal layer F1 or the second metal layer F2, or the two layers including the first metal layer F1 and the second metal layer F2 may be constituted by three or more metal layers, or the third metal layer F4 may be constituted by two or more metal layers.

Next, the operations and effects achieved by the aforementioned multilayer ceramic capacitor 10 are explained.

Figure 4:
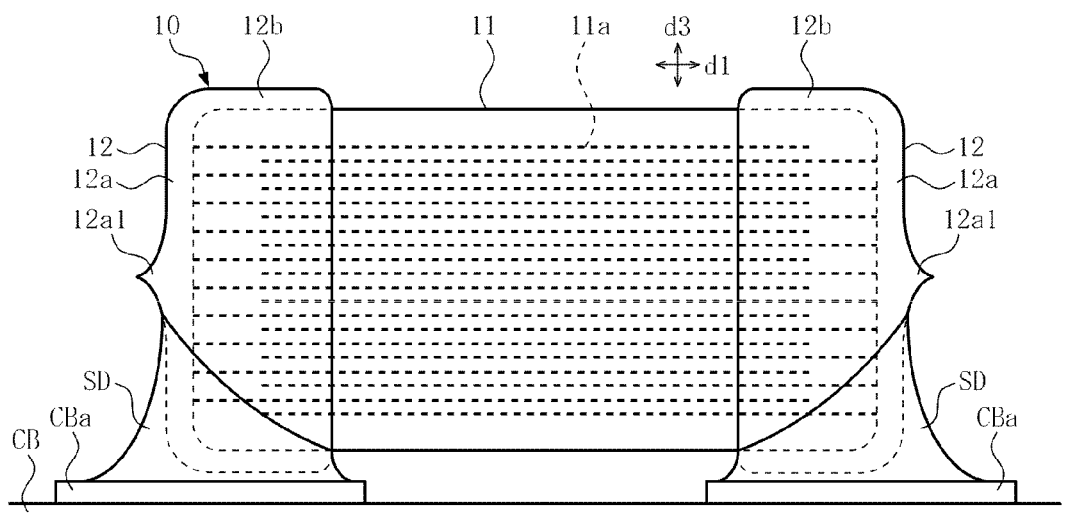
FIG. 4 is a drawing showing the multilayer ceramic capacitor shown in FIG. 1, of which external electrodes are connected to conductor pads on a circuit board by means of solder.

As shown in FIG. 4, in a state after the multilayer ceramic capacitor 10 has been mounted on a circuit board CB, or specifically after each of the external electrodes 12 has been connected to each of conductor pads CBa on the circuit board CB using solder SD, the wetting and spreading of the solder SD on the outer face of the end face part 12a of each of the external electrodes 12 is prevented by the bulging part 12a1, while the wetting and spreading of the solder SD on the outer face of a part (a part facing each of the conductor pads CBa) of the wraparound part 12b of each of the external electrodes 12 is permitted, regardless of the first-direction dimension D1 [11], the second-direction dimension D2 [11] and the third-direction dimension D3 [11] of the capacitor body 11.

In other words, judging from the aforementioned wetting and spreading behaviors of the solder SD, it is believed that an effective operation to prevent the Manhattan phenomenon is achieved by providing the bulging part 12a1 on the outer face of the end face part 12a of each of the external electrodes 12, or preferably in the center area on the outer face of the end face part 12a. In addition, it is believed that an effective operation to prevent the Manhattan phenomenon is also achieved with the bulging part 12a1 forming a tapered solid shape.

In addition, it is also believed that an effective operation to prevent the Manhattan phenomenon is achieved by setting the first-direction dimension D1 [12] of each of the external electrodes 12 including the bulging part 12a1 as equal to or greater than 10% of the first-direction dimension D1 [10] of the multilayer ceramic capacitor 10.

Furthermore, it is also believed that an effective operation to prevent the Manhattan phenomenon is achieved by setting the first-direction dimension D1 [F3a+F3a1] of the end face part F3a of the conductive resin layer F3 of each of the external electrodes 12 including the bulging part F3a1 as equal to or greater than 1% of the first-direction dimension D1 [10] of the multilayer ceramic capacitor 10.

Furthermore, it is also believed that an effective operation to prevent the Manhattan phenomenon is achieved by setting the first-direction dimension D1 [F3a] of the end face part F3a of the conductive resin layer F3 of each of the external electrodes 12 excluding the bulging part F3a1 as equal to or smaller than 48% of the first-direction dimension D1 [F3a+F3a1] of the end face part F3a of the conductive resin layer F3 including the bulging part F3a1.

Furthermore, it is also believed that an effective operation to prevent the Manhattan phenomenon is achieved by setting the third-direction dimension D3 [F3b] of the wraparound part F3b of the conductive resin layer F3 of each of the external electrodes 12 as equal to or smaller than the first-direction dimension D1 [F3a+F3a1] of the end face part F3a of the conductive resin layer F3 including the bulging part F3a1.

Next, an example of verification of the aforementioned operations and effects is explained by citing FIG. 5.

For the verification, 400 units each of the prototypes PR1 to PR26 shown in FIG. 5 were prepared. The specifications of the prototypes PR1 to PR26 are described below.

<Common Specifications>

The primary component of the capacitor body 11 excluding the internal electrode layers 11a is barium titanate, and the primary component of the internal electrode layers 11a is nickel.

With respect to the capacitor body 11, the first-direction dimension D1 [11] is 1000 μm, while the second-direction dimension D2 [11] and the third-direction dimension D3 [11] are 500 μm.

The first metal layer F1 of each of the external electrodes 12 is a baked metal layer of which the primary component is nickel, and the first-direction dimension D1 [F1] of the first metal layer F1 is 3 μm.

The second metal layer F2 of each of the external electrodes 12 is an electroplated metal layer of which the primary component is copper, and the first-direction dimension D1 [F2] of the second metal layer F2 is 1 μm.

The conductive resin layer F3 of each of the external electrodes 12 is a thermosetting conductive resin layer of which primary components are epoxy resin and copper conductive filler.

The third metal layer F4 of each of the external electrodes 12 has a two-layer structure, consisting of an inner electroplated metal layer F4a of which the primary component is nickel and an outer electroplated metal layer F4b of which the primary component is tin, where a first-direction dimension D1 [F4a], a second-direction dimension D2 [F4a], and a third-direction dimension D3 [F4a] of the inner metal layer F4a are 3 µm, while a first-direction dimension D1 [F4b], a second-direction dimension D2 [F4b], and a third-direction dimension D3 [F4b] of the outer metal layer F4b are 4 µm.

<Noncommon Specifications>

(1) The prototypes PR1 to PR9 in the first group all had their first-direction dimension D1 [F3a+F3a1] of the end face part F3a of the conductive resin layer F3 including the bulging part F3a1 set to 25 µm, all had their first-direction dimension D1 [F3a] of the end face part F3a of the conductive resin layer F3 excluding the bulging part F3a1 set to 3 µm, and all had their third-direction dimension D3 [F3b] of the wraparound part F3b of the conductive resin layer F3 set to 15 µm (same with the second-direction dimension D2 [F3b]), with the only difference being the first-direction dimension D1 [12] of each of the external electrodes 12 including the bulging part 12a1. Since this first-direction dimension D1 [12] was varied by varying a first-direction dimension D1 [12b] of the wraparound part 12b of each of the external electrodes 12, or specifically by varying a first-direction dimension D1 [F3b] of the wraparound part F3b of the conductive resin layer F3, the first-direction dimension D1 [10] of the multilayer ceramic capacitor 10 was 1060 µm with all of the prototypes.

It should be noted that, because the conductive resin layer F3 was produced by applying a conductive resin paste according to a dip method and then thermally curing the conductive resin paste, some prototypes, particularly those of which first-direction dimension D1 [F3b] of the wraparound part F3b of the conductive resin layer F3 was small, exhibited slight roundness in the outer face of the wraparound part F3b, although it is not shown in FIG. 2 or 3. For this reason, the third-direction dimension D3 [F3b] (corresponding to a thickness) of the wraparound part F3b of the conductive resin layer F3 was measured at an approximate center part (corresponding to a part giving the largest value) of the wraparound part F3b in the first direction d1.

(2) The prototypes PR10 to PR14 in the second group all had their first-direction dimension D1 [12] of each of the external electrodes 12 including the bulging part 12a1 set to 250 µm, all had their first-direction dimension D1 [F3a] of the end face part F3a of the conductive resin layer F3 excluding the bulging part F3a1 set to 3 µm, and all had their third-direction dimension D3 [F3b] of the wraparound part F3b of the conductive resin layer F3 set to 15 µm (same with the second-direction dimension D2 [F3b]), with the only difference being the first-direction dimension D1 [F3a+F3a1] of the end face part F3a of the conductive resin layer F3 including the bulging part F3a1. Since this first-direction dimension D1 [F3a+F3a1] was varied by varying a first-direction dimension D1 [F3a1] of the bulging part F3a1, the first-direction dimension D1 [10] of the multilayer ceramic capacitor 10 was slightly different with each of the prototypes PR10 to PR14.

(3) The prototypes PR15 to PR20 in the third group all had their first-direction dimension D1 [12] of each of the external electrodes 12 including the bulging part 12a1 set to 250 µm, all had their first-direction dimension D1 [F3a+F3a1] of the end face part F3a of the conductive resin layer F3 including the bulging part F3a1 set to 25 µm, and all had their third-direction dimension D3 [F3b] of the wraparound part F3b of the conductive resin layer F3 set to 15 µm (same with the second-direction dimension D2 [F3b]), with the only difference being the first-direction dimension D1 [F3a] of the end face part F3a of the conductive resin layer F3 excluding the bulging part F3a1. Since this first-direction dimension D1 [F3a] was varied without changing the first-direction dimension D1 [F3a+F3a1] of the end face part F3a of the conductive resin layer F3 including the bulging part F3a1, the first-direction dimension D1 [10] of the multilayer ceramic capacitor 10 was 1060 µm with all of the prototypes.

(4) The prototypes PR21 to PR26 in the fourth group all had their first-direction dimension D1 [12] of each of the external electrodes 12 including the bulging part 12a1 set to 250 µm, all had their first-direction dimension D1 [F3a+F3a1] of the end face part F3a of the conductive resin layer F3 including the bulging part F3a1 set to 25 µm, and all had their first-direction dimension D1 [F3a] of the end face part F3a of the conductive resin layer F3 excluding the bulging part F3a1 set to 3 µm, with the only difference being the third-direction dimension D3 [F3b] of the wraparound part F3b of the conductive resin layer F3 (same with the second-direction dimension D2 [F3b]). Since changing this third-direction dimension D3 [F3b] did not change the first-direction dimension D1 [10] of the multilayer ceramic capacitor 10, this first-direction dimension D1 [10] was 1060 µm with all of the prototypes.

As for the verification method, which is illustrated in FIG. 4, the same type of solder paste SD was applied by the same quantity on conductor pads CBa on verification circuit boards CB, which are prepared beforehand. Then, the prototypes PR1 to PR26 were installed on the verification circuit boards CB by pressing onto the applied solder paste SD, with the same load, a part (part corresponding to one face surrounding the component body 11) of the wraparound part 12b of each of the external electrodes 12 of the prototypes PR1 to PR26. After that, the verification circuit boards CB on which the prototypes PR1 to PR26 had been installed were put in a reflow oven and soldered under the same conditions. Then, the condition of the soldered prototypes PR1 to PR26 were visually checked, and those units that were standing up were counted. The "Manhattan phenomenon" column in FIG. 5 shows the number of units that were standing up, in the format of "n/400," for each of the prototypes PR1 to PR26.

It should be noted that, since the prototypes PR1 to PR9 had their first-direction dimension D1 [12] of each of the external electrodes 12 including the bulging part 12a1 varied, or specifically had their first-direction dimension D1 [12b] of the wraparound part 12b varied, verification circuit boards CB having conductor pads CBa of which first-direction dimension D1 [CBa] corresponded to the first-direction dimension D1 [12b] of the wraparound part 12b were used for these prototypes PR1 to PR9.

<Consideration on First Group>

Of the prototypes PR1 to PR9 that varied only in the first-direction dimension D1 [12] of each of the external electrodes 12 including the bulging part 12a1, none of the units of the prototypes PR2 to PR9 exhibited the Manhattan phenomenon. In other words, the Manhattan phenomenon was prevented when the first-direction dimension D1 [12] of each of the external electrodes 12 including the bulging part 12a1 was equal to or greater than 10% of the first-direction dimension D1 [10] of the multilayer ceramic capacitor 10.

It should be noted that, on the prototype PR9 of which first-direction dimension D1 [12] of each of the external electrodes 12 including the bulging part 12a1 was 490 μm, an exterior defect caused by shorting of the external electrodes 12 via the third metal layer F4 (the inner metal layer F4a and the outer metal layer F4b) was visible, which probably has to do with small spacing between the external electrodes 12 in the first direction d1. In other words, preferably the first-direction dimension D1 [12] of each of the external electrodes 12 including the bulging part 12a1 is equal to or smaller than 40% of the first-direction dimension D1 [10] of the multilayer ceramic capacitor 10.

<Consideration on Second Group>

Of the prototypes PR10 to PR14 that varied only in the first-direction dimension D1 [F3a+F3a1] of the end face part F3a of the conductive resin layer F3 including the bulging part F3a1, none of the units of the prototypes PR11 to PR14 exhibited the Manhattan phenomenon. In other words, the Manhattan phenomenon was prevented when the first-direction dimension D1 [F3a+F3a1] of the end face part F3a of the conductive resin layer F3 including the bulging part F3a1 was equal to or greater than 1% of the first-direction dimension D1 [10] of the multilayer ceramic capacitor 10.

It should be noted that, although making the first-direction dimension D1 [F3a+F3a1] of the end face part F3a of the conductive resin layer F3 including the bulging part F3a1 greater than 25 μm, the dimension of that on the prototype PR14, is possible, allowing this first-direction dimension D1 [F3a+F3a1] to exceed 25 μm increases a first-direction dimension D1 [12a+12a1] of the end face part 12a of each of the external electrodes 12 including the bulging part 12a1 accordingly, and the first-direction dimension D1 [10] of the multilayer ceramic capacitor 10 increases as a result. Since this is against the call for making the multilayer ceramic capacitors 10 smaller, preferably in practical settings, the first-direction dimension D1 [F3a+F3a1] of the end face part F3a of the conductive resin layer F3 including the bulging part F3a1 is equal to or smaller than 10% the first-direction dimension D1 [12] of each of the external electrodes 12 including the bulging part 12a1.

<Consideration on Third Group>

Of the prototypes PR15 to PR20 that varied only in the first-direction dimension D1 [F3a] of the end face part F3a of the conductive resin layer F3 excluding the bulging part F3a1, none of the units of the prototypes PR15 to PR19 exhibited the Manhattan phenomenon. In other words, the Manhattan phenomenon was prevented when the first-direction dimension D1 [F3a] of the end face part F3a of the conductive resin layer F3 excluding the bulging part F3a1 was equal to or smaller than 48% of the first-direction dimension D1 [F3a+F3a1] of the end face part F3a of the conductive resin layer F3 including the bulging part F3a1.

It should be noted that, on the prototype PR15 of which first-direction dimension D1 [F3a] of the end face part F3a of the conductive resin layer F3 excluding the bulging part F3a1 was 2 μm, an exterior defect involving the outer face of the end face part F3a of the conductive resin layer F3 partially not covered by the third metal layer F4 (the inner metal layer F4a and the outer metal layer F4b) was visible, which probably has to do with a small value of this first-direction dimension D1 [F3a]. In other words, preferably the first-direction dimension D1 [F3a] of the end face part F3a of the conductive resin layer F3 excluding the bulging part F3a1 is equal to or greater than 12% of the first-direction dimension D1 [F3a+F3a1] of the end face part F3a of the conductive resin layer F3 including the bulging part F3a1.

<Consideration on Fourth Group>

Of the prototypes PR21 to PR26 that varied only in the third-direction dimension D3 [F3b] of the wraparound part F3b of the conductive resin layer F3 (same with the second-direction dimension D2 [F3b]), none of the units of the prototypes PR21 to PR25 exhibited the Manhattan phenomenon. In other words, the Manhattan phenomenon was prevented when the third-direction dimension D3 [F3b] of the wraparound part F3b of the conductive resin layer F3 was equal to or smaller than the first-direction dimension D1 [F3a+F3a1] of the end face part F3a of the conductive resin layer F3 including the bulging part F3a1.

It should be noted that, on the prototype PR21 of which third-direction dimension D3 [F3b] of the wraparound part F3b of the conductive resin layer F3 was 3 μm, an exterior defect involving the outer face of the wraparound part F3b of the conductive resin layer F3 partially not covered by the third metal layer F4 (the inner metal layer F4a and the outer metal layer F4b) was visible, which probably has to do with the small value of this third-direction dimension D3 [F3b]. In other words, preferably the third-direction dimension D3 [F3b] of the wraparound part F3b of the conductive resin layer F3 is greater than the first-direction dimension D1 [F3a] of the end face part F3a of the conductive resin layer F3 excluding the bulging part F3a1.

Although the foregoing explanations illustrated the multilayer ceramic capacitor 10 as an example of an electronic component to which the present invention is applied, the present invention can also be applied to electronic components other than the multilayer ceramic capacitor 10, such as multilayer ceramic varistors and multilayer ceramic inductors, as well as multilayer ceramic capacitor arrays, multilayer ceramic LC hybrid components, multilayer ceramic LCR hybrid components, and so on.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-219978, filed Nov. 15, 2017, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. An electronic component comprising a component body of roughly rectangular solid shape, and external electrodes provided at two opposing respective end parts of the component body, which external electrodes each have a conductive resin layer inside, wherein, with respect to the component body, a direction in which two opposing faces are facing each other represents a first direction, a direction in which other two opposing faces are facing each other represents a second direction, and a direction in which the remaining two opposing faces are facing each other represents a third direction, and dimensions along the respective directions are denoted as a first-direction dimension, a second-direction dimension, and a third-direction dimension, each external electrode has an end face part corresponding to a first-direction end face of the component body, and a wraparound part continuously extending from the end face part to four faces of the component body surrounding the first-direction end face of the component body; and the end face part of each external electrode has a bulging part on an outer face of the end face part, which bulging part outwardly bulges in the first direction and has a thickness greater than a thickness of a portion of the end face part other than the bulging part, wherein the bulging part of each external electrode forms a tapered solid shape.

2. The electronic component according to claim 1, wherein the bulging part of each external electrode is provided in a center area on the outer face of the end face part of each external electrode.

3. An electronic component comprising a component body of roughly rectangular solid shape, and external electrodes provided at two opposing respective end parts of the component body, which external electrodes each have a conductive resin layer inside, wherein, with respect to the component body, a direction in which two opposing faces are facing each other represents a first direction, a direction in which other two opposing faces are facing each other represents a second direction, and a direction in which the remaining two opposing faces are facing each other represents a third direction, and dimensions along the respective directions are denoted as a first-direction dimension, a second-direction dimension, and a third-direction dimension, each external electrode has an end face part corresponding to a first-direction end face of the component body, and a wraparound part continuously extending from the end face part to four faces of the component body surrounding the first-direction end face of the component body; and the end face part of each external electrode has a bulging part on an outer face of the end face part, which bulging part outwardly bulges in the first direction and has a thickness greater than a thickness of a portion of the end face part other than the bulging part, wherein:

the conductive resin layer of each external electrode continuously has an end face part corresponding to the first-direction end face of the component body, and a wraparound part continuously extending from the end face part to the four faces of the component body surrounding the first-direction end face of the component body;

the end face part of the conductive resin layer has a bulging part on an outer face of the end face part, corresponding to the bulging part of the external electrode, wherein the bulging part has a thickness greater than a thickness of a portion of the end face part other than the bulging part; and the conductive resin layer is such that an entire outer face of the conductive resin layer is covered by at least one metal layer.

4. The electronic component according to claim 3, wherein in each external electrode, the bulging part of the conductive resin layer is provided in an center area on the outer face of the end face part of the conductive resin layer, corresponding to the center area on the outer face of the end face part of the external electrode.

5. The electronic component according to claim 3, wherein in each external electrode, the bulging part of the conductive resin layer forms a tapered solid shape.

6. The electronic component according to claim 1, wherein in each external electrode, a second metal layer is provided between the conductive resin layer and the first-direction end face of the component body.

7. The electronic component according to claim 6, wherein the second metal layer consists of two metal layers.

8. An electronic component comprising a component body of roughly rectangular solid shape, and external electrodes provided at two opposing respective end parts of the component body, which external electrodes each have a conductive resin layer inside, wherein, with respect to the component body, a direction in which two opposing faces are facing each other represents a first direction, a direction in which other two opposing faces are facing each other represents a second direction, and a direction in which the remaining two opposing faces are facing each other represents a third direction, and dimensions along the respective directions are denoted as a first-direction dimension, a second-direction dimension, and a third-direction dimension, each external electrode has an end face part corresponding to a first-direction end face of the component body, and a wraparound part continuously extending from the end face part to four faces of the component body surrounding the first-direction end face of the component body; and the end face part of each external electrode has a bulging part on an outer face of the end face part, which bulging part outwardly bulges in the first direction and has a thickness greater than a thickness of a portion of the end face part other than the bulging part, wherein a first-direction dimension of each external electrode including the bulging part and the wraparound part is equal to or greater than 10% of a first-direction dimension of the electronic component.

9. The electronic component according to claim 8, wherein the first-direction dimension of each external electrode including the bulging part and the wraparound part is equal to or smaller than 40% of the first-direction dimension of the electronic component.

10. The electronic component according to claim 3, wherein in each external electrode, a first-direction dimension of the end face part, excluding the wraparound part, of the conductive resin layer including the bulging part is equal to or greater than 1% of the first-direction dimension of the electronic component.

11. The electronic component according to claim 10, wherein the first-direction dimension of the end face part, excluding the wraparound part, of the conductive resin layer including the bulging part is equal to or smaller than 10% of the first-direction dimension of each external electrode including the bulging part.

12. The electronic component according to claim 3, wherein in each external electrode, a first-direction dimension of the end face part of the conductive resin layer excluding the bulging part and the wraparound part is equal to or smaller than 48% of the first-direction dimension of the end face part of the conductive resin layer including the bulging part.

13. The electronic component according to claim 12, wherein the first-direction dimension of the end face part of the conductive resin layer excluding the bulging part and the wraparound part is equal to or greater than 12% of the first-direction dimension of the end face part of the conductive resin layer including the bulging part.

14. The electronic component according to claim 3, wherein in each external electrode, a second- or third-direction dimension of the wraparound part of the conductive resin layer on a second- or third-direction face of the component body is equal to or smaller than a first-direction dimension of the end face part of the conductive resin layer including the bulging part and the wraparound part.

15. The electronic component according to claim 14, wherein the second- or third-direction dimension of the wraparound part of the conductive resin layer on the second- or third-direction face of the component body is greater than the first-direction dimension of the end face part of the conductive resin layer excluding the bulging part and the wraparound part.

16. The electronic component according to claim 1, wherein a first-direction dimension of the component body is set in a range of 400 to 1600 µm, while a second-direction dimension and a third-direction dimension of the component body are set in a range of 50 to 800 µm.

17. The electronic component according to claim 1, wherein the electronic component is a multilayer ceramic capacitor.

18. An electronic component mounting circuit board constituted by the electronic component according to claim 1 being mounted on a circuit board.

19. The electronic component mounting circuit board according to claim 18, wherein the external electrodes of the electronic component are connected to conductor pads on the circuit board by means of solder.

* * * * *